Aug. 28, 1962 J. W. WARING 3,051,904

REFLEXED AMPLIFIER CIRCUIT

Filed March 15, 1960

INVENTOR.
JOHN W. WARING
BY Robert D. Sanborn
ATTORNEY

United States Patent Office 3,051,904

Patented Aug. 28, 1962

3,051,904

REFLEXED AMPLIFIER CIRCUIT

John W. Waring, Palmyra, N.J., assignor, by mesne assignments, to Philco Corporation, Philadelphia, Pa., a corporation of Delaware Filed Mar. 15, 1960, Ser. No. 15,156
7 Claims. (Cl. 325—486)

The present invention relates to signal amplifier circuits and more particularly to dual frequency reflex amplifier circuits.

In the design of broadcast receivers or the like it is frequently desirable to employ a reflexed circuit in which one or more stages act both as an amplifier for an audio-modulated carrier wave signal and as an amplifier for the demodulated audio signal. Since the reflexed stage is supplied with both the modulated carrier wave signal and the demodulated signal, the operating point for the stage is varied over a large area of the collector current-collector voltage characteristic of the amplifier element. Usually great care must be exercised in selecting a quiescent operating point which will avoid the saturation region for peak audio modulation signals of one polarity and the cutoff region for peak audio modulation signals of the opposite polarity. The problem is particularly acute in transistor circuits employing a low supply voltage. If the operating point is such that the transistor is driven to cutoff by the combination of the two input signals supplied thereto, the stage may motorboat, that is, oscillate at a low frequency determined by the time constants of the circuit which are included in or are connected to the amplifier stage. The further difficulty arises in transistor reflex stages that the non-uniformity of certain transistor characteristics makes it necessary to select individually the biasing potential and/or associated impedances for each transistor, to add a stabilizing resistor in the emitter circuits of the transistor to minimize the effect of the variation in the operating characteristics of the transistor or, as still another alternative, to reduce the amplitude of the signal supplied to the stage thereby to ensure by one of these three means that the stage is not driven to saturation or cutoff.

The individual selection of biasing potentials or associated impedances is costly and makes this choice unacceptable for use with mass production items. The use of the usual form of emitter stabilizing circuit and the reduction in the amplitude of signals supplied to the stage are both undesirable in that they reduce the maximum amplitude of the signal that can be obtained from the stage.

It is an object of the present invention to provide an improved dual frequency reflexed amplifier circuit in which the tendency to motorboat is reduced.

It is a further object to provide an improved dual frequency reflexed amplifier circuit in which emitter stabilization of the transistors is achieved without appreciable loss of gain.

Still another object is to provide a transistor reflexed amplifier circuit capable of handling relatively large signal amplitudes while requiring only a relatively low supply potential.

These and other objects of the present invention are achieved by providing a reflexed amplifier circuit in which the polarity of the audio signal fed back to the input of the reflexed stage is so chosen that it tends to move the operating point of the transistor toward the cutoff region on the peaks of the modulated input signal and toward the saturation region on valleys of the modulated input signal.

A further feature of the invention is that the amplifier is so constructed that the audio load impedance acts also as an emitter stabilizing resistor thus providing emitter stabilization of the transistor without loss of gain.

For a better understanding of the present invention together with other and further objects thereof reference should now be made to the following detailed description which is to be read in conjunction with the accompanying drawings in which.

Figure 1:
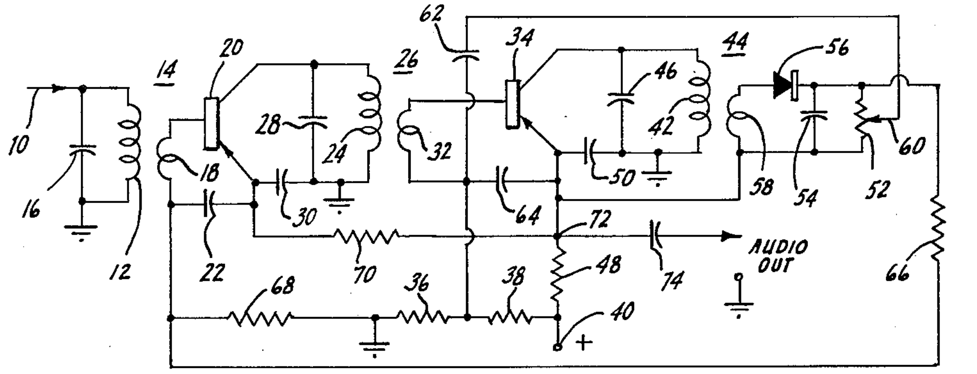
FIG. 1 is a schematic diagram of one preferred embodiment of the invention.

In the circuit of FIG. 1 the intermediate frequency signal is received on connection 10 from a converter or heterodyne mixer. Connection 10 represents the ungrounded terminal of the primary 12 of an interstage coupling transformer 14. Primary 12 is tuned in the usual fashion by capacitor 16. The secondary winding 18 of transformer 14 is connected directly to the base of transistor 20 and to the emitter of this transistor 20 by way of an automatic gain control filter capacitor 22. The collector of transistor 20 is connected to ground through the tuned load impedance which comprises the primary 24 of a second interstage coupling transformer 26 and the shunt capacitor 28. The emitter of transistor 20 may be connected to ground by means of a capacitor 30 to reduce the effect of intermediate frequency regeneration or second harmonic pickup. If the chassis layout is such that the circuit is not susceptible to intermediate frequency regeneration or second harmonic pickup, capacitor 30 may be omitted.

The secondary winding 32 of interstage coupling transformer 26 has one terminal connected to the base of a second transistor 34. Transistor 34 is the reflexed transistor in the circuit shown. The second terminal of secondary winding 32 is connected to a point of positive bias potential provided by the potential divider 36—38. This divider is connected between ground and the source of positive bias potential schematically represented by terminal 40. The collector of transistor 34 is connected to ground through the primary winding 42 of a third interstage coupling transformer 44. Winding 42 represents the intermediate frequency load impedance for transistor 34. Primary winding 42 is tuned to the intermediate frequency by capacitor 46. The emitter of transistor 34 is connected to terminal 40 through a resistor 48. It will be shown presently that resistor 48 functions as the degenerative stabilizing resistor for transistors 20 and 34 and as the audio load impedance for the reflexed circuit. The emitter of transistor 34 is bypassed to ground at intermediate frequencies by a capacitor 50.

Potentiometer 52 and capacitor 54 form the audio load impedance and intermediate frequency bypass, respectively, for a diode detector 56. This detector circuit is supplied with an intermediate frequency signal from the secondary winding 58 of transformer 44. As will be shown in more detail presently, the polarity of diode detector 56 is important to the proper operation of the circuit of FIG. 1.

The common terminals of secondary winding 58, capacitor 54 and resistor 52 are connected to the emitter of transistor 34. This common connection is hereinafter identified as terminal 72. The movable tap 60 on potentiometer 52 is connected through an audio frequency coupling capacitor 62 to the low signal side of secondary winding 32. The low signal side of secondary winding 32 is bypassed to the emitter of transistor 34 by way of capacitor 64 in order to reduce intermediate frequency regeneration or second harmonic pickup. Again, if the chassis layout is such that intermediate frequency regeneration is not induced and second harmonic pickup is not a problem, capacitor 64 may be omitted.

The positive end of potentiometer 52 is connected to the base of transistor 20 through resistor 66 and secondary winding 18 to provide an automatic gain control signal for transistor 20. Resistor 68 is employed to obtain the proper direct voltage bias on the base of transistor 20. The supply voltage for resistor 68 is obtained from terminal 40 by way of resistors 48, 52 and 66 connected in series. Capacitor 22 bypasses the low signal side of winding 18 to the emitter of transistor 20 at audio and intermediate frequencies. Since winding 18 is a low impedance at audio frequencies the base of transistor 20 is effectively at emitter potential at audio frequencies. A degenerative stabilizing resistor 70 is connected between the emitter of transistor 20 and the terminal 72. It will be seen that emitter-collector potential for transistor 20 is supplied by way of resistors 48 and 70.

The audio frequency output signal from the circuit of FIG. 1 may be obtained from terminal 72 by way of D.C. blocking capacitor 74.

The system of FIG. 1 operates in the following manner: the intermediate frequency signal supplied on connection 10 is amplified by transistor 20 and supplied to the base-emitter circuit of transistor 34 by way of secondary winding 32. It will be noted that one terminal of secondary winding 32 is connected to the emitter for intermediate frequency signals by bypass capacitor 64, if present. If capacitor 64 is not present, the low signal side of secondary winding 32 is bypassed to the emitter for intermediate frequencies by capacitors 62 and 54 and potentiometer 52. The intermediate frequency signal is again amplified by transistor 34 and supplied to the audio detector element 56 by secondary winding 58. The detected audio frequency signal appears across the detector load impedance, that is, potentiometer 52. The polarity of detector element 56 is such that the end of potentiometer 52 which is remote from the emitter of transistor 34, i.e. remote from terminal 72, is more positive than the end connected to emitter 34. A portion of the audio signal appearing across resistor 52 is coupled by way of tap 60, coupling capacitor 62 and secondary winding 32 to the base of transistor 34. Secondary winding 32 appears as a low impedance to the audio frequency signal. Since one end of potentiometer 52 is connected directly to the emitter of transistor 34, the transistor 34 and resistor 48 are connected so as to form a bootstrap amplifier circuit. The amplified audio frequency signal appearing across resistor 48 may be coupled from terminal 72 by way of D.C. blocking capacitor 74. Since the position of tap 60 on potentiometer 52 controls the amount of audio frequency signal supplied between base and emitter of transistor 34, tap 60 functions as a volume control for the reflexed circuit.

The direct current component developed by detector 56, which is representative of average signal level, is supplied by way of resistors 66 and 68 to the base of transistor 20. This signal will control the average current flowing in the emitter-collector circuit of transistor 20. It will be seen that the base-to-emitter current of both transistors 20 and 34 flows through resistor 48. This in effect lowers the emitter voltage of transistor 34. However, under the high signal condition, the automatic gain control signal supplied to the base of transistor 20 reduces the average current through this transistor and hence reduces the average current through resistor 48. This results in an increase in the effective emitter voltage of transistor 34, thus increasing the power handling capability of this reflex stage when it is most needed.

Previous circuits which have utilized a single transistor for simultaneous amplification of intermediate frequency and audio frequencies have been subject to the disadvantage that they would tend to oscillate at an audio frequency rate if the intermediate frequency signal increases in amplitude to the point where the stage overloads. I have discovered that this tendency to oscillate is due to the fact that the negative modulation peaks of the modulated IF carrier tend to drive the reflexed transistor toward cutoff along the audio frequency load line. If the amplitude of the audio frequency is such that the transistor is driven to cutoff due to the audio frequency signal, the intermediate frequency signal to the second detector is suddenly reduced to zero. This will tend to drive the base of the reflexed transistor further into the cutoff region along the audio frequency load line. The transistor will remain cut off until the time constant of the detector and the feedback circuit permits the transistor to return to conduction. At that time an intermediate frequency signal abruptly appears at the detector. This may drive the transistor well into conduction. In extreme cases the transistor may be driven into saturation which results in the clipping of the intermediate frequency signal. In extreme cases the behaviour of the reflexed stage will be similar to that of a multivibrator and will be stable only at saturation and cutoff.

Figure 3:
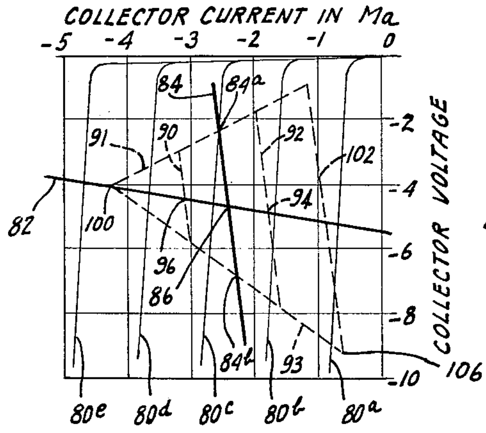
FIG. 3 is a plot of the operating characteristics of the circuits of FIGS. 1 and 2.

The diagram of FIG. 3 illustrates how the problem of oscillation of the reflexed stage is overcome by the circuit of the present invention. Curves $80^a$ through $80^e$ represent curves of collector voltage as a function of collector current for various values of base voltage. Line 82 in FIG. 3 represents the audio load line for transistor 34. The slope of line 82 is determined by the size of resistor 48. In the initial explanation of the diagram of FIG. 3 the current through transistor 20 will be neglected. Line 84 in FIG. 3 represents the intermediate frequency load line for transistor 34. The slope of line 84 is determined by the effective impedance presented by the intermediate frequency load 42—46 of transistor 34. The quiescent operating point for FIG. 3 is represented at 86. The segment of the line 84 between points $84^a$ and $84^b$ represents the average or unmodulated amplitude of the intermediate frequency wave. With no audio modulation of the intermediate frequency signal supplied at connection 10, the operating point of transistor 34 moves back and forth along line 84 between the points $84^a$ and $84^b$ at the intermediate frequency of the system. If the incoming wave is unmodulated, there will be no audio output signal and the operating point will not move along the audio load line 82.

Suppose now that the intermediate frequency carrier wave supplied at connection 10 is 30% modulated by a sinusoidal audio frequency signal. The amplitude of the carrier wave will vary between limits represented by the length of the line segments 90 and 92. At the same time the operating point 86 will be moved along line 82 between the limits 94 and 96. Thus the operating point of transistor 34 will scan the trapezoidal area bounded by lines 96 and 94 and the broken lines 91 and 93 which are drawn through the points $84^a$, and $84^b$ and the ends of the line segments 90 and 92, in a rectalinear raster moving parallel to line 84 at the intermediate frequency rate and parallel ot line 82 at the audio frequency rate. As noted above, the polarity of detector 56 is such that the base of transistor 34 is moved in the positive direction as the carrier wave supplied to the base increases in amplitude. If the input carrier wave is 100% modulated by an audio frequency signal, the operating point will vary along audio frequency load line between point 100 at the intersection of lines 91 and 93 and line 102. Thus the operating point will scan the triangular area defined by line 102 and the lines 91 and 93.

If the amplitude of the unmodulated carrier wave increases without any change in the percentage of modulation, the triangle defined by the lines 91, 93 and 102 will expand in all directions but will retain the same general shape. That is, the line 102 will lengthen and move toward the right as the amplitude of the audio wave increases and the amplitude of the carrier wave increases. Point 100 will move to the left towards the saturation region of the transistor.

If the apex 106 of the operating region is driven into the cutoff region of the transistor 34, clipping of the positive peaks of the audio frequency signal will result, but there will be no tendency of the circuit to be driven further into cutoff. Therefore there will be no tendency for the circuit of FIG. 1 to oscillate.

The decrease in the average current through transistor 20, which results from an increase in automatic gain control voltage, decreases the voltage drop across resistor 48. This will have the effect of making the emitter of transistor 34 more positive with respect to the base. It will also have the effect of increasing the emitter-to-collector voltage of transistor 34. This will move the quiescent operating point of the system of FIG. 3 to the left in the direction of more negative base voltage and down in the direction of increased collector voltage. This will have the effect of moving the triangular operating region of the transistor away from the cutoff region if the average amplitude of the carrier wave increases. Thus one of the primary functions of the automatic gain control circuit of FIG. 1 is to prevent cutoff from occurring in the reflexed amplifier stage on high average amplitudes of the carrier wave.

In FIG. 1, the two transistors 20 and 34 are both p-n-p type transistors. In some instances, it may be desirable to employ an n-p-n type transistor as the first or intermediate frequency amplifier transistor and a p-n-p type transistor as the reflexed transistor.

Figure 2:
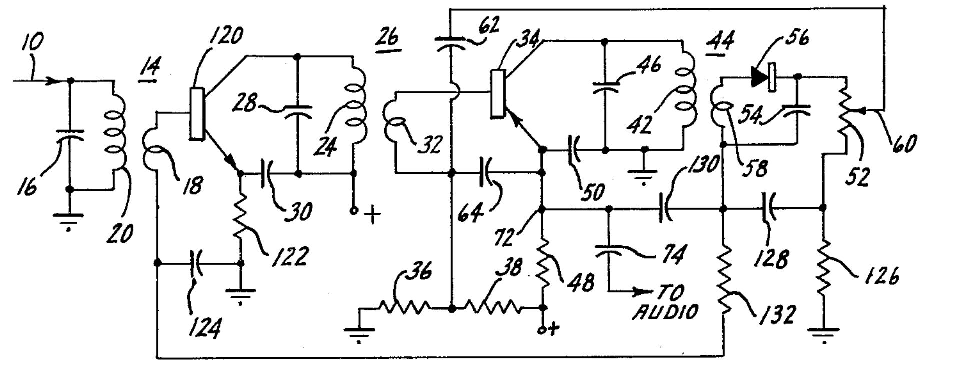
FIG. 2 is a schematic diagram of a second preferred embodiment of the present invention.

FIG. 2 is a circuit diagram of such an arrangement. Parts in FIG. 2 corresponding to like parts in FIG. 1 have been identified by the same reference numerals. In the circuit of FIG. 2 the emitter of the transistor 120 is connected to ground through a separate degenerative stabilizing resistor 122. The end of secondary winding 18 which is remote from the base of transistor 120 is bypassed to ground for audio frequency signals by capacitor 124. The collector is connected to one terminal of the tuned load circuit 24—28 while the other terminal of this load circuit is connected to a source of positive potential. In the reflexed stage, the proper polarity of automatic gain control voltage for the transistor 120 is obtained by connecting one end of resistor 52 to ground through a second resistor 126. The junction of resistors 52 and 126 is then coupled to the common terminals of capacitor 54 and secondary winding 58 by means of an audio frequency bypass capacitor 128. A second audio frequency bypass capacitor 130 couples the common terminals of capacitor 54 and secondary winding 58 to point 72. Thus it will be seen that for audio frequencies the lower terminal of potentiometer 52 is coupled to the emitter of transistor 34 as in FIG. 1. The automatic gain control voltage for transistor 120 is taken from the junction of capacitors 128 and 130 by way of decoupling resistor 132. No automatic gain control voltage is supplied to transistor 34 in the circuit of FIG. 2. It will be seen from FIG. 2 that the direct current path for diode 56 is completed by way of potentiometer 52, resistor 126, resistor 122 in the emitter circuit of transistor 120, the emitter-base circuit of transistor 120, primary winding 18, resistor 132 and secondary winding 58. The operation of the circuit of FIG. 3 is similar to the operation of FIG. 1 except that the quiescent operating point of the reflexed stage is not shifted by the automatic gain control voltage.

Both the circuits of FIG. 1 and FIG. 2 employ a p-n-p type transistor in the reflexed stage. The circuit may be modified to employ an n-p-n type transistor. If so modified, the diode 56 must be poled so that an increase in the amplitude of the carrier wave signal drives the operating point of the transistor toward cutoff along the audio frequency load line.

A suitable audio frequency transformer may be inserted in the circuit between potentiometer 52 and the base of transistor 34 as an alternative means for selecting the proper polarity or phase of the audio frequency signal supplied to the base-emitter circuit of transistor 34.

While the invention has been described with reference to certain preferred embodiments thereof, it will be apparent that various modifications and other embodiments thereof will occur to those skilled in the art within the scope of the invention. Accordingly we desire the scope of our invention to be limited only by the appended claims.

I claim:

1. A reflexed amplifier circuit comprising a transistor element having a base, an emitter, and a collector, intermediate frequency coupling means connected to the base-emitter circuit of said transistor, detector means, means coupling said detector means to the emitter-collector circuit of said transistor, audio frequency coupling means coupling the output of said detector means to the base-emitter circuit of said transistor, said detector means being poled so that the peaks of a modulated intermediate frequency signal supplied to said intermediate frequency coupling means tend to move the operating point of said transistor in the direction of collector current cutoff, an audio frequency load resistor connected in series with the emitter-collector path of said transistor and providing a direct current path from said emitter to a point of fixed reference potential, and means for deriving an audio frequency output signal from said load resistor.

2. A reflexed amplifier circuit in accordance with claim 1 wherein said detector means comprises diode detector means and a resistor-capacitor load connected in circuit with said diode detector means.

3. A reflexed amplifier circuit comprising first and second transistor elements each having a base, an emitter and a collector, first intermediate frequency coupling means connected to the base-emitter circuit of said first transistor, second intermediate frequency coupling means coupling the emitter-collector circuit of said first transistor to the emitter-base circuit of said second transistor, detector means coupled to the emitter-collector circuit of said second transistor, audio frequency coupling means coupling the output of said detector means to the base-emitter circuit of said second transistor, said detector means being poled so that peaks of a modulated intermediate frequency signal supplied to said second intermediate frequency coupling means tend to move the operating point of said second transistor in the direction of collector current cutoff, a load resistor having one terminal connected to said emitter of said second transistor, a second terminal of said resistor being adapted for connection to a source of bias potential, a second resistor connected between said emitter of said first transistor and said emitter of said second transistor, low pass filter means providing a direct current connection from the output of said detector to said base-emitter circuit of said first transistor, and means for deriving a detected output signal from said load resistor.

4. A reflexed amplifier circuit comprising a transistor element having a base, an emitter, and a collector, intermediate frequency coupling means connected to the base-emitter circuit of said transistor, a diode detector element, a load impedance connected in series with said diode detector element, means coupled to the emitter-collector circuit of said transistor for supplying the intermediate frequency output signal of said transistor to said series combination of the detector element and said load impedance, said last-mentioned coupling means providing a low impedance coupling to ground for said collector at audio frequencies, one terminal of said load impedance being conductively connected directly to the emitter of said transistor, means coupling a point on said load impedance remote from said one terminal to the base of said transistor at audio frequencies, an audio load resistor having one terminal connected to the emitter of said transistor and a second terminal adapted to be connected to a source of bias potential, said diode detector element being poled so that the peaks of a modulated intermediate frequency signal supplied to said intermediate frequency coupling means tend to move the operating point of said transistor toward cutoff, and means for deriving an audio frequency output signal from said audio frequency load resistor.

5. A reflexed amplifier circuit in accordance with claim 4 wherein, said reflexed amplifier circuit further comprises a second transistor having a base, an emitter, and a collector, means for supplying a modulated intermediate frequency signal to be amplified to the base-emitter circuit of said second transistor, means coupling the emitter-collector circuit of said second transistor to said intermediate frequency coupling means connected to the base-emitter circuit of the first-mentioned transistor, means conductively connecting the emitter of said first-mentioned transistor to the emitter of said second transistor, whereby the emitter-collector current of said two transistors flows through said audio load resistor, and low pass filter means providing a direct current connection from the output of said detector means to the base of said second transistor means.

6. A reflexed amplifier circuit comprising a transistor having an emitter, a collector, and a base, intermediate frequency coupling means connected to the base-emitter circuit of said transistor, a tuned interstage coupling transformer, the first and second end terminals of the primary of said transformer being coupled substantially directly to the emitter and collector, respectively, of said transistor at intermediate frequencies, a diode detector element, a detector load impedance, said load impedance being connected in series with said diode detector element, capacitive means bypassing said detector load impedance at intermediate frequencies, means coupling the secondary winding of said interstage transformer across said load impedance and said detector element at intermediate and audio frequencies, one terminal of said secondary winding being coupled to said emitter for audio frequencies, means coupling a tap on said load impedance to the base of said transistor at audio frequencies, an audio frequency load resistor having one terminal connected to said emitter and a second terminal adapted to be connected to a source of bias potential, said resistor providing a direct current path between said emitter and said second terminal, and means for deriving an output signal from across said load resistor.

7. A reflexed amplifier circuit comprising first and second transistor elements each having a base, an emitter and a collector, first intermediate frequency coupling means connected to the base-emitter circuit of said first transistor, second intermediate frequency coupling means coupling the emitter-collector circuit of said first transistor to the emitter-base circuit of said second transistor, detector means coupled to the emitter-collector circuit of said second transistor, audio frequency coupling means coupling the output of said detector means to the base-emitter circuit of said second transistor, said detector means being poled so that peaks of a modulated intermediate frequency signal supplied to said second intermediate frequency coupling means tend to move the operating point of said second transistor in the direction of collector current cutoff, a load resistor having one terminal connected to said emitter of said second transistor, a second terminal of said resistor being adapted for connection to a source of bias potential, a second resistor connected at one end to the emitter of said first transistor and at the other end to the emitter of said second transistor whereby the emitter currents of said first and second transistors flow through said load resistor, low pass filter means providing a direct current connection from the output of said detector to said base-emitter circuit of said first transistor, the point of connection of said low pass filter to said detector means being such that said first transistor is biased in a direction to decrease the average current therethrough in response to an increase in the average amplitude of the signal supplied to said detector means, and means for deriving an audio frequency output signal from said load resistor.

References Cited in the file of this patent

UNITED STATES PATENTS 2,853,603 Herold ---------------- Sept. 23, 1958

OTHER REFERENCES

"Design Considerations for Transistor Reflex Receivers" by Fournier, pages 35–38 of Semiconductor Products for May/June 1958.

Philco Transistor Data Sheet T1690, July 1959.